United States Patent

Drake et al.

[11] 4,242,982
[45] Jan. 6, 1981

[54] APPARATUS FOR METAL COATING OF POWDERS

[75] Inventors: Miles P. Drake; Sarah Y. Hughes, both of Harlow, England

[73] Assignee: International Standard Electric Corporation, New York, N.Y.

[21] Appl. No.: 39,625

[22] Filed: May 16, 1979

[30] Foreign Application Priority Data

May 25, 1978 [GB] United Kingdom ............... 22454/78

[51] Int. Cl.³ ............................................. B05D 7/00
[52] U.S. Cl. ................................. 118/716; 118/722; 118/726; 427/215; 427/216
[58] Field of Search ................... 118/716, 726, 727; 427/215, 216

[56] References Cited

U.S. PATENT DOCUMENTS

| | | | |
|---|---|---|---|
| 3,594,215 | 7/1971 | Wakefield | 118/716 |
| 3,617,347 | 11/1971 | Kuratomi et al. | 427/215 |
| 3,826,225 | 7/1974 | Forman | 118/716 |
| 3,826,226 | 7/1974 | Clark | 118/716 |

*Primary Examiner*—Jack P. Brammer
*Attorney, Agent, or Firm*—John T. O'Halloran; Alfred C. Hill

[57] ABSTRACT

One shot coating of powdered material with a metal film is achieved by allowing the material to fall through a vertical refractory cylinder, the inside of which is covered with the metal. The process takes place in a vacuum chamber and the cylinder is heated to evaporate the metal onto the falling material as it passes through the cylinder.

10 Claims, 2 Drawing Figures

APPARATUS FOR METAL COATING OF POWDERS

BACKGROUND OF THE INVENTION

This invention relates to the coating of powdered or granular materials, or even small piece parts with metal films.

SUMMARY OF THE INVENTION

According to the invention there is provided apparatus for coating powdered or granular materials with metal films including a vacuum chamber having disposed therein at its upper part means for creating a free flowing stream of the material to be coated falling through the central portion of the chamber, a body of refractory material having a vertical face positioned in the central part of the chamber such that the falling stream of material falls adjacent the vertical face of the body, the vertical face having its surface covered with a layer of the metal to be deposited on the particles of material in the falling stream, and means for heating the body to a temperature sufficient to raise the vapor pressure of the metal covering to cause evaporation of the metal while the stream of material falls past the face under vacuum conditions.

BRIEF DESCRIPTION OF THE DRAWINGS

The above and other features of the invention will now be described with reference to the accompanying drawings in which.

Figure 1:
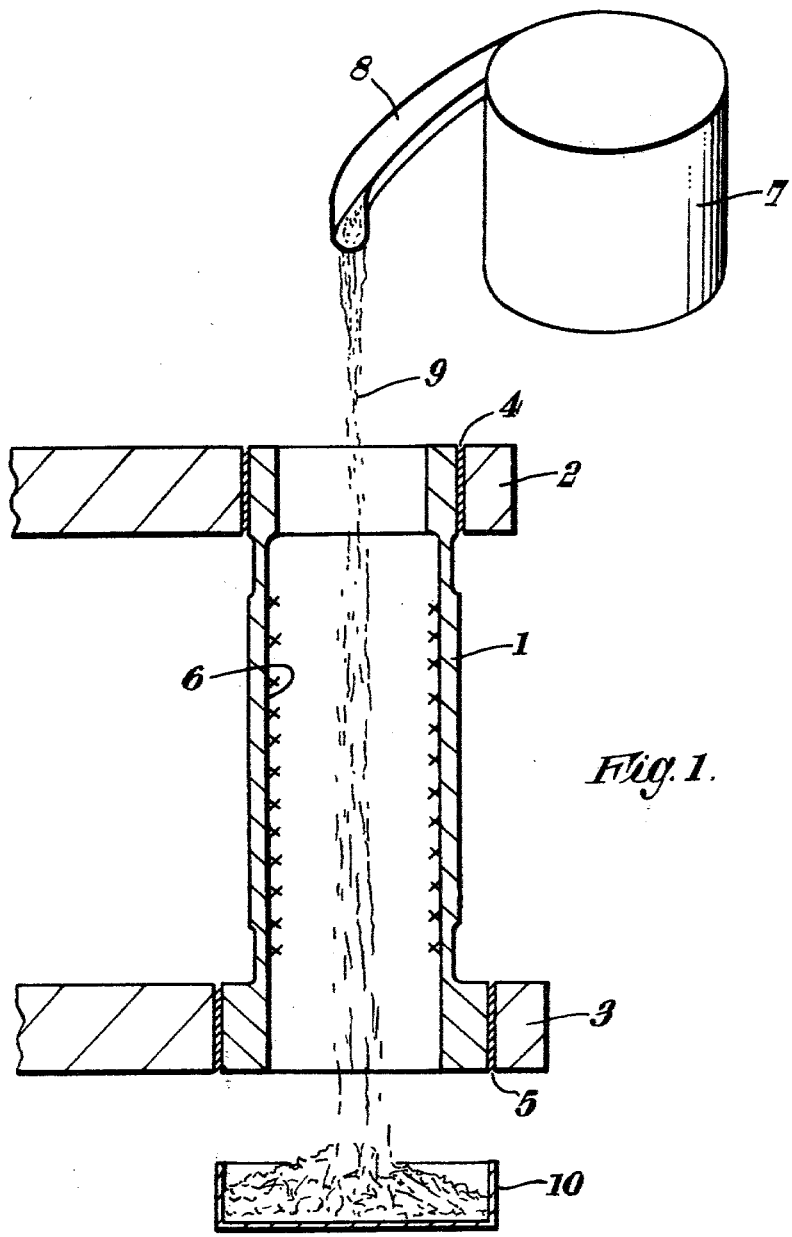
FIG. 1 illustrates one embodiment of the invention.

Although the coating process takes place in a vacuum chamber the latter is not shown in the drawings as it is a conventional piece of laboratory equipment.

DETAILED DESCRIPTION OF THE INVENTION

In the embodiment of FIG. 1 a cylinder 1 made of an electrically conducting refractory material such as titanium diboride, boron nitride ($TiB_2.BN$) is placed vertically in the center of the chamber and is clamped top and bottom in water cooled electrodes 2,3. Good electrical contact between the electrodes and the tube is ensured by placing layers 4, 5 of graphite paper or cloth around the contact areas of the cylinder before clamping the electrodes. The inner surface of the cylinder is covered with a layer 6 of the metal to be deposited on the powdered or granular material. Situated above the cylinder 1 is a vibratory feed device 7 which delivers, via a chute 8, a free flowing stream 9 of the powdered or granular material to be coated with metal from the layer 6 as the stream falls through the cylinder 1. Below the cylinder there is placed a receptacle 10 to receive the coated material.

A typical example of the invention utilizes a $TiB_2.BN$ tube 4 inches long by one inch diameter, with a wall thickness intermediate the electrode clamped portions of ⅛ inch. The inner surface of the cylinder is coated with aluminum. The vacuum chamber is evacuated down to $10^{-5}$ Torr and a current of 400 amps is passed through the cylinder 1 which as a result heats up to 1100° C. In one experiment the inside of the cylinder 1 was only coated after it has been heated in the vacuum by feeding aluminum wire into the cylinder 1 where it melted when it came into contact with the cylinder surface.

Alternative materials for the cylinder 1 may be molybdenum or tantalum. Metals which can be evaporated include copper, silver, gold, tin, lead.

Figure 2:
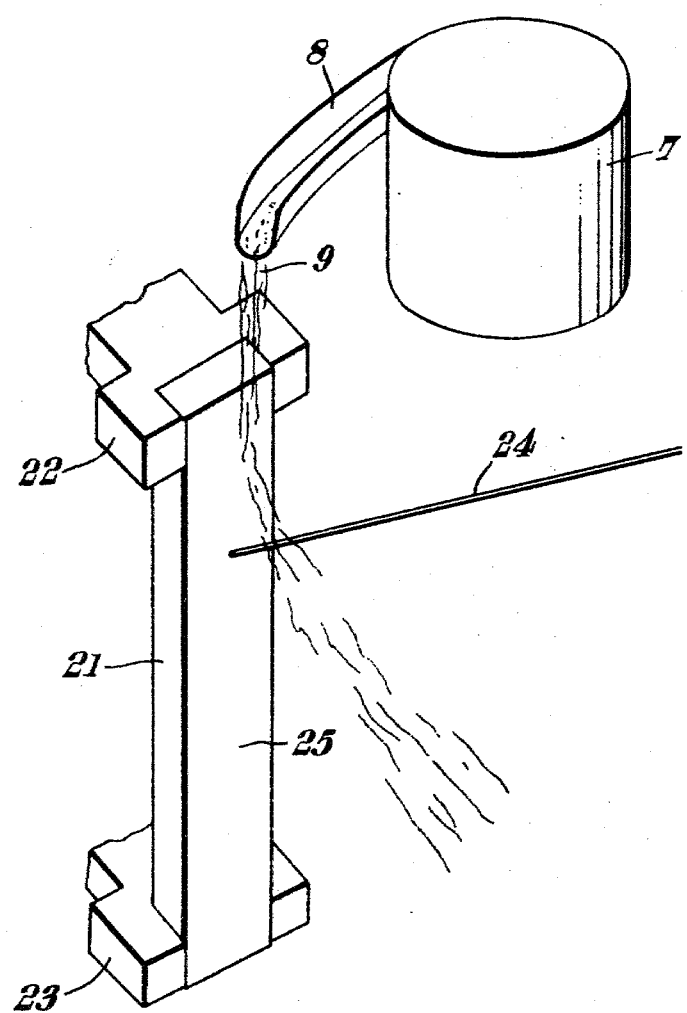
FIG. 2 illustrates another embodiment of the invention.

In the embodiment shown in FIG. 2 the granular material 9 is allowed to fall close to the vertical face of a bar of refractory material 21, which is made of a conducting substance such as those previously mentioned. The bar is held in clamping electrodes 22, 23 and is heated by an electric current passing through it. A wire 24 of coating metal such as aluminum is fed to the face 25 of the bar 21 where it melts and flows to cover the face of the bar. The temperature of the bar is maintained high enough to cause evaporation of the aluminum. The granular material falling past the face thus falls through a cloud of molten aluminum vapor and the falling particles are coated with aluminum. The vapor pressure of the molten metal is sufficient to cause deflection of the particles as they become coated, and the particle stream is thus deflected away from the bar. In practice we have found that the higher the temperature the greater the vapor pressure and the better the coating of the particles. Conversely, if the vapor pressure is insufficient to coat the particles satisfactorily they are not greatly deflected. The arrangement of FIG. 2 is therefore such that positioning a receptacle (not shown) at a suitable horizontal distance from the bar ensures that only satisfactorily coated particles are collected in the receptacle.

While we have disclosed various techniques for coating powdered or granular materials, it will be apparent to those skilled in the art that other alternatives and embodiments may be employed without departing from the scope of our invention as set forth in the appended claims.

We claim:

1. Apparatus for coating powdered or granular material with metal films in a vacuum chamber which comprises means for creating a free flowing stream of the material to be coated falling through the central portion of the chamber, a body of refractory material having a vertical face positioned in the central part of the chamber such that the falling stream of material falls adjacent the vertical face of the body, the vertical face having its surface covered with a layer of the metal to be deposited on the particles of material in the falling stream, and means disposed adjacent opposite ends of the body for heating the body to a temperature sufficient to raise the vapor pressure of the metal covering to cause evaporation of the metal while the stream of material falls past the face under vacuum conditions.

2. Apparatus according to claim 1 wherein the means for creating free flowing stream comprises a vibratory feed device.

3. Apparatus according to claim 1 wherein the body of refractory material is made of a ceramic material.

4. Apparatus according to claim 3 wherein the body is made of titanium bidoride, boron nitride ($TiB_2.BN$).

5. Apparatus according to claim 1 wherein the body is made of metal.

6. Apparatus according to claim 5 wherein the metal is either molybdenum or tantalum.

7. Apparatus according to claim 1 wherein the means for heating the body comprise water cooled electrodes clamped around the ends of the body.

8. Apparatus according to claim 1 in which the body is a tube and the granular material falls down the center of the tube.

9. Apparatus according to claim 1 wherein the body has a flat vertical surface and the granular material falls adjacent the flat surface.

10. Apparatus according to claim 9 including a receptacle placed at a distance horizontal from the vertical flat face to catch coated particles deflected by vapor pressure from the flat face.

* * *